United States Patent [19]

Takemae

[11] 4,397,001
[45] Aug. 2, 1983

[54] SEMICONDUCTOR MEMORY DEVICE

[75] Inventor: Yoshihiro Takemae, Yokohama, Japan

[73] Assignee: Fujitsu Limited, Kawasaki, Japan

[21] Appl. No.: 248,069

[22] Filed: Mar. 27, 1981

[30] Foreign Application Priority Data

Mar. 27, 1980 [JP] Japan .................................. 55/39260

[51] Int. Cl.³ ............................................. G11C 13/00
[52] U.S. Cl. ..................................... 365/189; 365/193
[58] Field of Search ............... 365/174, 182, 189, 193, 365/222

[56] References Cited
U.S. PATENT DOCUMENTS 4,158,891 6/1979 Fisher .................................. 365/222

Primary Examiner—Terrell W. Fears
Attorney, Agent, or Firm—Staas & Halsey

[57] ABSTRACT

A semiconductor memory device of a dynamic type, including a read/write circuit in a column circuit in which a data input pin and a data output pin are common. The read/write circuit comprises a data-output buffer (DOB) connected through a three-state circuit (Qa, Qb) to the common data input/output terminal (I/O), and a data write-in buffer of a dynamic type having a latching function and being connected between the common data input/output terminal and data buses, for providing latched data to the data buses. By utilizing a rise or a fall of a write enable signal or a column address strobe signal applied to the memory device, the three-state circuit is set to be a high impedance, and then, write data is latched into the data write-in buffer.

8 Claims, 18 Drawing Figures

Fig. IA
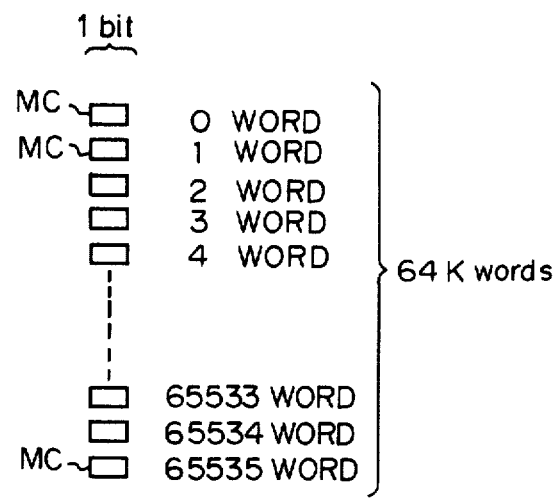
Fig. IB
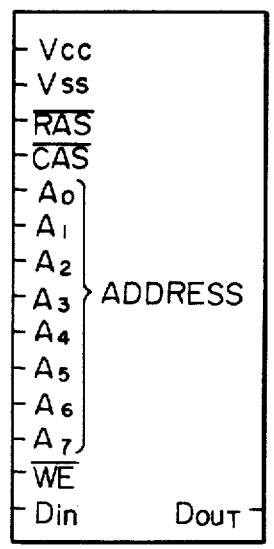

SEMICONDUCTOR MEMORY DEVICE

BACKGROUND OF THE INVENTION

This invention relates to a semiconductor memory device, and more particularly to a data read/write portion of a dynamic memory device.

In general, a semiconductor memory device consists basically of a row circuit for driving word lines, a column circuit for driving bit lines and for executing writing or reading operations, and a number of memory cells connected between the word lines and the bit lines, for storing information therein. The present invention mainly relates to the column circuit, which is, in other words, a data read/write portion of the semiconductor memory device.

On one chip of the memory device, there are various pins such as those for receiving power supply voltages, for receiving clocks, for receiving address signals, and for data input and data output. It is an essential problem for a large scale integrated circuit to decrease the number of pins.

There is known a memory device in which data-input pins and data-output pins are commonly used having a decreased number of pins. Such an I/O pin common system has been realized in a static memory. However, in a dynamic memory, such an I/O pin common system has not yet been realized without employing a static circuit. When the static circuit is included in the dynamic memory, a large amount of power is consumed by the static circuit so that the superior feature of low power consumption in the dynamic memory device is deteriorated.

SUMMARY OF THE INVENTION

It is therefore an object of the present invention to provide a dynamic semiconductor memory device, in which power consumption is reduced in comparison with a conventional device, without increasing the number of pins on the device.

Another object of the invention is to provide a semiconductor memory device, in which a data write-in buffer included in a column circuit of the device is of a dynamic type.

According to the present invention, there is provided a semiconductor memory device of a dynamic type including a read/write circuit in a column circuit for reading data from or writing data into a memory cell in response to column driving signals. The read/write circuit comprises a common input/output terminal (I/O) for inputting write data into or for outputting read data from the memory cell; a data output buffer (DOB) for outputting read data to the I/O terminal from the memory cell; a three-state circuit (Qa, Qb), connected between the common input/output terminal and the data output buffer, for setting the common input/output terminal to a high impedance or a state according to the read data; and a data write-in buffer (DWB), having a latching function, connected between the common input/output terminal and the memory cell. The column circuit further comprises a first means for turning off the three-state circuit so as to set the common input/output terminal to a high impedance, in response to one state of the column circuit driving signals; and a second means for latching write data applied to the common input/output terminal into the data write-in buffer, in response to another state of the column driving signals.

The data write-in buffer is a dynamic circuit comprising a bistable circuit for latching the write data and a write-in circuit for writing the latched-write data into the memory cell.

It is preferable that the column circuit driving signals comprise a write enable signal for setting the read/write circuit to a write enable state when the write enable signal is turned on and that the first means comprise a latching circuit for providing a latched driving signal, in response to a turning on of the write enable signal, the latched driving signal being used to keep the three-state circuit in the off state even after the write enable signal is turned off.

According to one aspect of the invention, the second means comprise a gate circuit having a first input for receiving the latched driving signal and a second input for receiving the write enable signal, the gate circuit generating a data write-in buffer-driving signal for setting the data write-in buffer to an enable state so as to latch the write data, in response to the turning off of the write enable signal.

According to another aspect of the invention, the column circuit driving signals comprises a write enable signal and a column-address strobe signal. The column-address strobe signal being used to set the data output buffer to a write enable state when the column-address strobe signal is turned off, the first means being constructed to keep the common input/output terminal to a high impedance when the column-address strobe signal is turned off. The second means comprises a latching circuit for providing a latched signal to keep the column-address strobe signal on even after said column-address strobe signal is turned off; and a write-enable buffer for providing a driving signal which is inputted to the data write-in buffer, the driving signal being provided when both the write-enable signal and the latched signal are applied to the write-enable buffer, the data write-in buffer being adapted to latch the write data when the data write-in buffer receives the driving signal.

These objects and other features of the present invention will be more apparent from the following description of the conventional device and of the embodiments of the present invention, with reference to the accompanying drawings.

BRIEF DESCRIPTION OF THE DRAWINGS

FIG. 1A is a schematic diagram for illustrating the structure of a memory device of 1-bit 64K-words;

FIG. 1B is a schematic plan view of the 1-bit 64K-word memory device, for illustrating input/output pins on the column decoder;

DESCRIPTION OF THE PREFERRED EMBODIMENTS

Figure 2A:
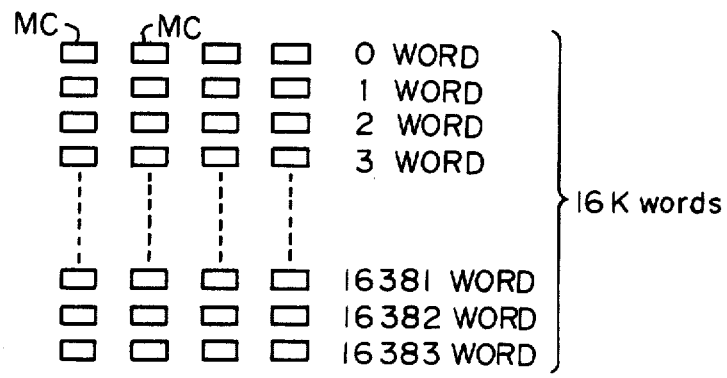
FIG. 2A is a schematic diagram for illustrating the structure of a 4-bit 16K-word memory device.

The capacity of the semiconductor memory device has been more and more increased. For example, a memory device of 1-bit 4k words, 1-bit 16k words, 1-bit 32k words, or 1-bit 64k words is known. Generally, in a memory device of m-bits nk words, the number of locations available, that is, the number of words is nk, each word consisting of m bits. In the following description, the 1-bit 64k-word memory device will be explained as an example.

FIG. 1A is a schematic diagram for illustrating the structure of the 1-bit 64k-word memory device. In FIG. 1A, the memory device of 1-bit 64k words has 64k memory cells MC. Each memory cell corresponds to one of 65,536 words. Therefore, each word consists of one bit. In order to access one of the 64k words, one of 256 word lines are specified by a row circuit, and then one of 256 bit lines are specified by a column circuit. For specifying one of the 256 bit lines, the column circuit must have eight address pins.

FIG. 1B is a schematic plan view of the 1-bit 64k-word memory device, for illustrating input/output pins on the column decoder. As illustrated in FIG. 1B, there are power supply pins Vcc and Vss, row address strobe and column address strobe pins $\overline{RAS}$ and $\overline{CAS}$ for setting the row circuit and column circuit in their enable states, respectively, eight address pins $A_0, A_1, \ldots,$ and $A_7$ for specifying one of the 256 word lines, and specifying one of the 256 bit lines, a write enable pin $\overline{WE}$ for enabling the circuit to write data into the memory cells, a data input pin $D_{in}$ for receiving input data and a data output pin $D_{out}$ for providing output data. The total number of the input/output pins is fifteen.

In the memory device of 1-bit 64k words, only one bit data is inputted or outputted, while the number of locations available is as many as 64k. When a plurality of bits of data are to be dealt with, a plurality of such memory devices must be provided. However, in a small system, the number of locations available is not required to be so large. By using a memory device having the same memory capacity of 64k, there is known a 4-bit 16k-word memory device.

FIG. 2A is a schematic diagram for illustrating the structure of the 4-bits 16k-word memory device. In FIG. 2A, the 4-bit 16k-word memory device has also 64k memory cells MC. The number of locations available, that is, the number of words is 16k. Each word consists of four bits. Thus, by using the 4-bits 16k words memory device, four-bit data can be dealt with. In order to access one of 16k words, one of 128 word lines are specified by a row circuit, and then one of 128 bit lines are specified by a column circuit. For specifying one of the 128 word lines and specifying one of the 128 bit lines, the memory device must have seven address pins. On the other hand, since 4-bit data is inputted into or outputted from this 4-bit 16k-word memory device, four input pins and four output pins for data input/output are necessary.

Figure 2B:
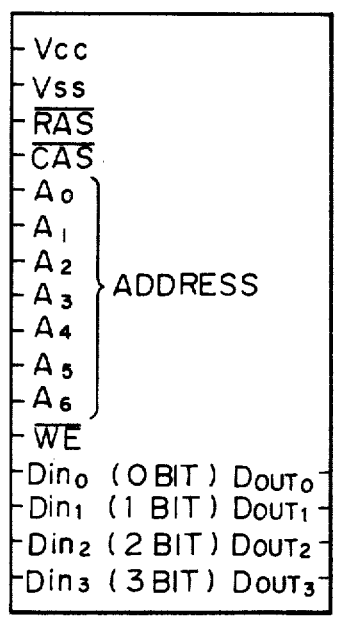
FIG. 2B is a schematic plan view of the 4-bit 16K-word memory device, for illustrating input/output pins on the column decoder.

FIG. 2B is a schematic plan view of the 4-bit 16k-word memory device, for illustrating input/output pins on the column circuit. On this device, there are also provided input pins Vcc, Vss, $\overline{RAS}$, $\overline{CAS}$ and $\overline{WE}$. The difference between FIG. 1B and FIG. 2B is that in FIG. 2B, seven address pins $A_0, A_1, \ldots, A_6$, four input pins $D_{in0}, D_{in1}, \ldots,$ and $D_{in3}$ for data input, and four output pins $D_{out0}, D_{out1}, \ldots$ and $D_{out3}$ are provided. The total number of the input/output pins is twenty, which is greater than the total number of the input/output pins in FIG. 1B.

In order to decrease the total number of the input/output pins in the 4-bit 16k-word memory device, a system is known in which each of data-input pins is also used as one of data-output pins.

Figure 3:
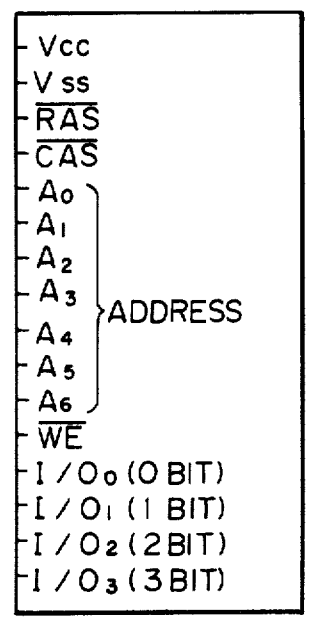
FIG. 3 is a schematic plan view of a 4-bit 16K-word memory device, in which data-input pins and data-output pins are commonly used.

FIG. 3 is a schematic plan view of a 4-bit 16k-word memory device, in which data-input pins and data-output pins are commonly used. As can be seen from FIG. 3, the total number of pins is sixteen, which is smaller than that of FIG. 2B.

Such an I/O-pin common system as illustrated in FIG. 3 has been realized only in a static memory device. In a dynamic memory device, however, there were some problems in realizing such an I/O-pin common system.

Figure 4A:
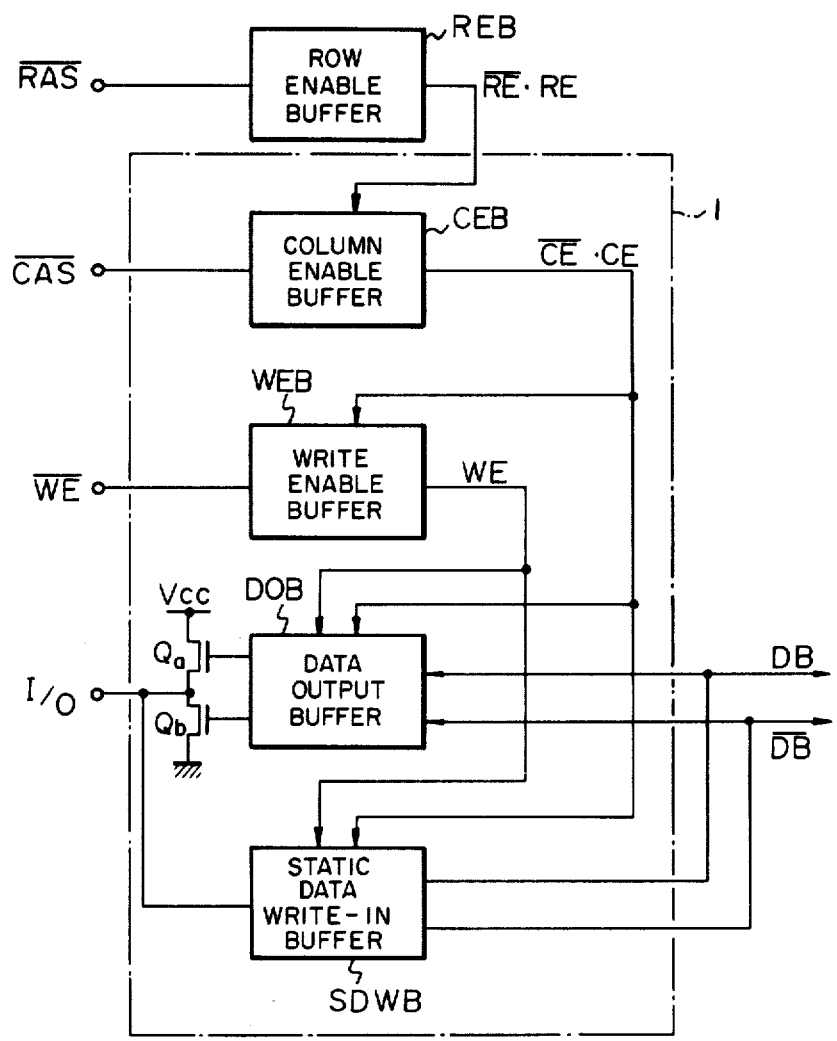
FIG. 4A is a block diagram for illustrating a part of a conventional column circuit of a dynamic memory device, in which a data-input pin and a data-output pin are commonly used.

FIG. 4A is a block diagram for illustrating a part of a conventional column circuit of a dynamic memory device, in which a data-input pin and a data-output pin are commonly used. Referring to FIG. 4A, the conventional column circuit 1 includes a column enable buffer CEB connected to the $\overline{CAS}$ pin for providing a column enable signal $\overline{CE}$ and its inverted signal CE, a write enable buffer WEB connected to the $\overline{WE}$ pin for providing a write enable signal WE, a data output buffer DOB connected through a three-state circuit including transistors $Q_a$ and $Q_b$ to the common input/output pin I/O, and a static data write-in buffer SDWB connected to the pin I/O.

In a reading operation, after a row address strobe signal $\overline{RAS}$ is supplied to a row enable buffer REB so that one of the word lines is selected, the row enable buffer REB provides a row enable signal to the column enable buffer CEB to set it in its enable state. Then, when the signal $\overline{CAS}$ turns to a low potential level (hereinafter referred to as the L level), the column enable buffer CEB generates the signal CE and $\overline{CE}$ which is then inputted to the data output buffer DOB and to the static data write-in buffer SDWB to set them in their enable states. In the reading operation, since the write enable buffer WEB does not provide the signal WE to the data output buffer DOB, at least one of the two transistors $Q_a$ and $Q_b$ is in an ON state. Therefore, data read from a memory cell (not shown) is transferred through the data output buffer DOB and one of the transistors $Q_a$ and $Q_b$ to the pin I/O.

After the reading operation, the writing operation is performed as follows. When the signal $\overline{WE}$ is turned to the L level, the write enable buffer WEB generates a write enable signal WE, which is then inputted into the data output buffer DOB to turn off the transistors $Q_a$ and $Q_b$. Thus, the impedance at the I/O pin becomes high. In this state, it is possible for the I/O pin to receive write data. The write enable signal WE is inputted into the static data write-in buffer SDWB to set it in its enable state. The static data write-in buffer SDWB receives the write data through the I/O pin so that the static data write-in buffer SDWB sets a data bus DB connected to the cell specified by a word line and a bit line to a high potential level H or a low potential level L, according to the write data. A signal on the data bus $\overline{DB}$ also connected to the static data write-in buffer SDWB is the inversion of the signal on the data bus DB. Thus, a datum "1" or "0" is written into a selected memory cell which is connected to the data bus DB and $\overline{DB}$.

However, in this conventional dynamic memory device of FIG. 4A, since the static data write-in buffer SDWB is a static circuit, it consumes electric power as long as it receives the write enable signal WE from the write enable buffer WEB. Therefore, the characteristic of the dynamic circuit is deteriorated.

Figure 4B:
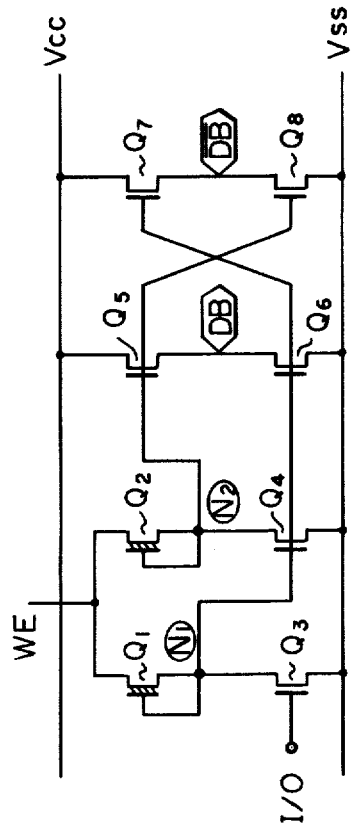
FIG. 4B is a circuit diagram of the static data write-in buffer included in the circuit of FIG. 4A.
Figure 4C:
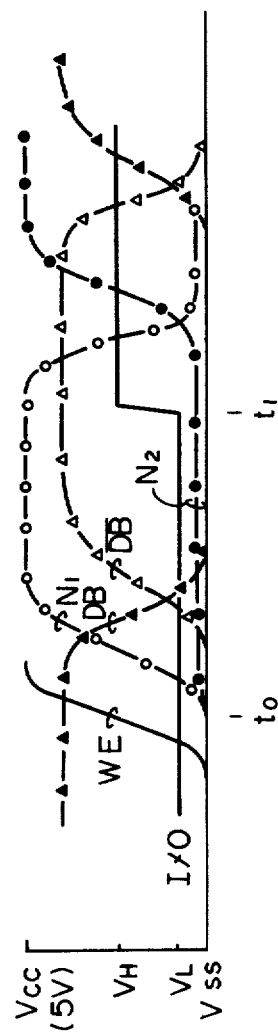
FIG. 4C is a time chart for explaining the operation of the circuit of FIG. 4B.

The disadvantage of the conventional dynamic memory device of FIG. 4A will be more apparent from FIG. 4B and FIG. 4C. FIG. 4B is a circuit diagram of the static data write-in buffer SDWB included in the circuit of FIG. 4A. Referring to FIG. 4B, transistors $Q_1$ and $Q_2$ are depletion-type MOS transistors having negative threshold voltages; and other transistors $Q_3$ through $Q_8$ are enhancement-type MOS transistors having positive threshold voltages. The transistors $Q_1$ and $Q_3$, as well as the transistors $Q_2$ and $Q_4$ are connected in series between the write enable input WE and the ground voltage Vss. The transistors $Q_5$ and $Q_6$, as well as the transistors $Q_7$ and $Q_8$ are connected in series between the power supply voltage Vcc and the ground voltage Vss. Write data is applied to the I/O pin connected to the gate of the transistor $Q_3$. The data bus DB is connected to a point between the source of the transistor $Q_5$ and the drain of the transistor $Q_6$. The inverted data bus $\overline{DB}$ is connected to a point between the source of the transistor $Q_7$ and the drain of the transistor $Q_8$. The gate of the transistor $Q_1$ is connected to its source, or a point $N_1$, which is connected to the gates of the transistor $Q_4$, $Q_6$ and $Q_7$. The gate of the transistor $Q_2$ is connected to its source, or a point $N_2$, which is connected to the gates of the transistors $Q_5$ and $Q_8$.

FIG. 4C is a time chart for explaining the operation of the circuit of FIG. 4B. Referring to FIGS. 4B and 4C, it is assumed that, at the first stage, the potential at the I/O pin is a lower threshold voltage $V_L$ and the potential of the data bus DB is the high level. At a time $t_0$, when the potential of the write enable signal WE is raised to the Vcc level, the potential at the point $N_1$ rises to the Vcc level so that the transistors $Q_4$, $Q_6$ and $Q_7$ are turned on. In this state, current flows through the transistors $Q_2$ and $Q_4$, and therefore, the potential at the point $N_2$ is kept at a low level so that the transistors $Q_5$ and $Q_8$ are turned off. Since the transistor $Q_6$ is turned on, charges on the data bus DB discharge through the transistor $Q_6$ to the ground voltage Vss. On the other hand, since the transistor $Q_8$ is in the off state, the inverted data bus $\overline{DB}$ is charged up from the power supply voltage Vcc through the transistor $Q_7$. Then, at a time $t_1$, when the potential at the I/O pin is raised to a higher threshold voltage $V_H$, the transistor $Q_3$ is turned on so that the potential at the point $N_1$ falls to a low level; and current flows through the transistors $Q_1$ and $Q_3$ to the ground. Since the gate of the transistor $Q_4$ is lowered, the transistor $Q_4$ is turned off. Therefore, the point $N_2$ is charged up so that the potential at the point $N_2$ is raised to the high level. Thus, the potential levels of the data buses DB and $\overline{DB}$ are inverted.

Since the circuit of FIG. 4B is of a static type, data can be freely inputted without any clock signal. Therefore, regardless of the input timing, the last-in data is written into the connected memory cell.

However, as has been explained, in the conventional circuit of FIG. 4B, current flows either through the transistors $Q_1$ and $Q_3$ or the transistors $Q_2$ and $Q_4$, regardless of whether the potential at the I/O pin is low or high. Therefore, a high power is consumed in the circuit of FIG. 4B.

If a data write-in buffer has a latching function, the data write-in buffer can be made as a dynamic type. However, in this case, clock signals for latching data are necessary. Further, these clocks must be slightly delayed after the clocks for setting the three state circuit to the high impedance are applied to the data output buffer DOB. If the former clocks are applied at the same time when the later clocks are applied, error data may be written into the memory cell. Of course, if a special clock signal is employed, the possibility of writing error data is eliminated. However, if such a special clock signal must be generated in the column decoder, the circuit will become complicated and the number of pins on the memory device will be increased.

The present invention will now be explained in the following. According to the present invention, a data write-in buffer of a dynamic type is employed, which is operated without using a special clock signal.

Figure 5A:
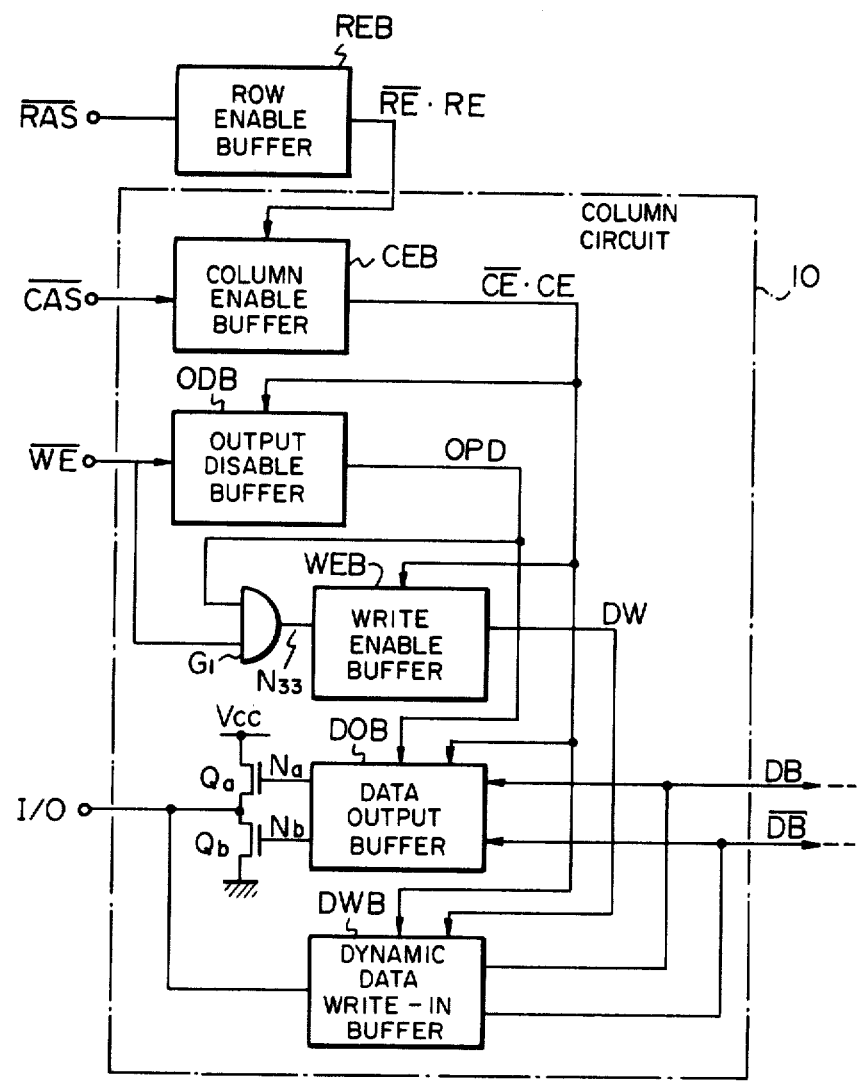
FIG. 5A is a block diagram for illustrating a part of a column circuit of a dynamic memory device, according to an embodiment of the present invention.

FIG. 5A is a block diagram for illustrating a part of a column circuit of a dynamic memory device, according to an embodiment of the present invention. The main differences between the circuit of FIG. 5A and the conventional circuit of FIG. 4A reside in that, in place of the static data write-in buffer SDWB in FIG. 4A, a dynamic data write-in buffer DWB having a function to latch input data is used in the circuit of FIG. 5A. Also, an output disable buffer ODB having a latching function and an AND gate $G_1$, which were not provided in the circuit of FIG. 4A, are provided in the circuit of FIG. 5A. In the column circuit 10 of the present embodiment, the output disable buffer ODB receives the inverted write enable signal WE and the column enable signals CE and $\overline{CE}$ for outputting an output disable signal OPD which is inputted into the first input of the AND gate $G_1$ and into the data output buffer DOB. The AND gate $G_1$ also receives at its second input the inverted write enable signal WE. The output of the AND gate $G_1$ is connected to the write enable buffer WEB. The other connections are the same as those in the conventional circuit of FIG. 4A, and therefore are not described here.

Figure 5B:
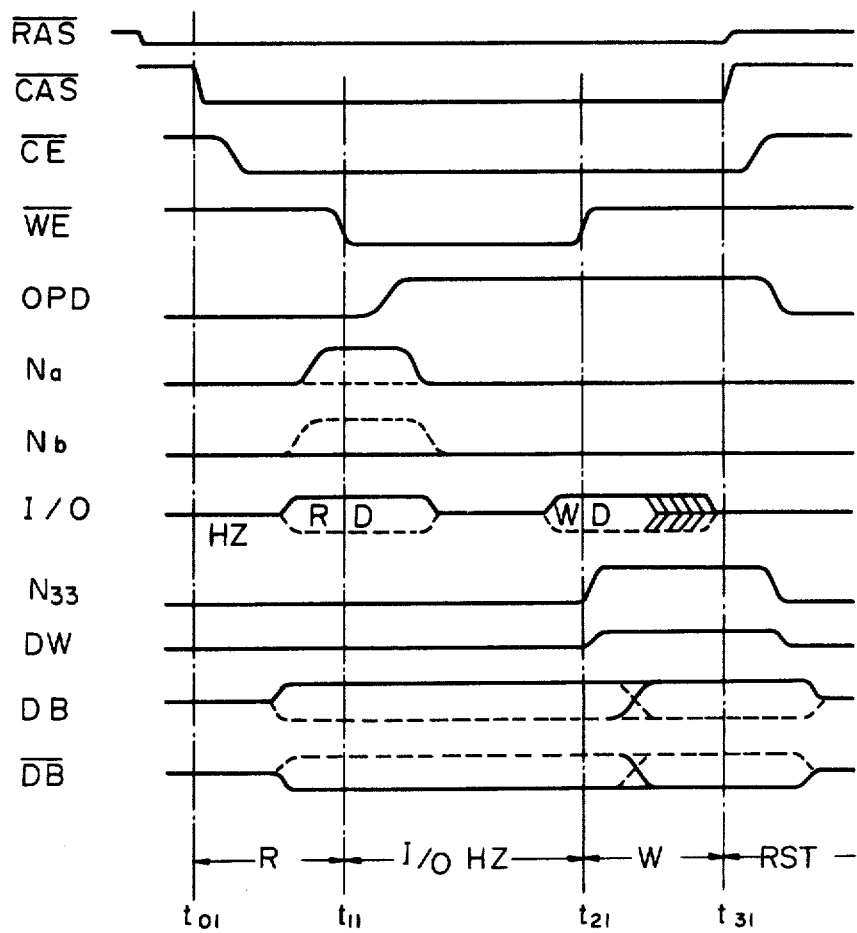
FIG. 5B is a time chart for explaining the operation of the column circuit of FIG. 5A.

FIG. 5B is a time chart for explaining the operation of the column circuit of FIG. 5A. Referring to FIGS. 5A and 5B, a reading operation will first be explained. After a row address strobe signal $\overline{RAS}$ is supplied to the row enable buffer REB so that one of the word lines is selected, the row enable buffer REB provides a row enable signal to the column enable buffer CEB to set it in its enable state. Then, at a time $t_{01}$, when the signal CAS turns to the L level, the column enable buffer CEB generates the signals CE and $\overline{CE}$ which are then inputted parallel to the output disable buffer ODB, write enable buffer WEB, data output buffer DOB and dynamic data write-in buffer DWB to set them in their enable states. However, at this time, since the inverted write enable signal $\overline{WE}$ is H, the output disable buffer ODB and the write enable buffer WEB do not operate as will be hereinafter described in detail. When the data output buffer DOB receives the signals CE and $\overline{CE}$, the data output buffer DOB sets at least one of the points Na or Nb to the high level. The points Na and Nb are connected to the gates of the transistors Qa and Qb, respectively. Therefore, at least one of the transistors Qa or Qb is turned on so that the state of the I/O pin is changed from high impedance HZ to the state according to the read data. Then, data read from the memory cell (not shown) is transferred through the data output buffer DOB and one of the transistors Qa and Qb to the I/O pin. The reading time is the time interval between the time $t_{01}$ and the time $t_{11}$.

At the time $t_{11}$, when the signal $\overline{WE}$ is turned to the L level, the output disable buffer ODB begins to operate so that its output disable signal OPD is turned to the H level. The H level signal OPD is supplied to the first input of the AND gate $G_1$ and to the data output buffer DOB. When the data output buffer DOB receives the H level signal OPD, the data output buffer DOB turns the potential level of the points Na and Nb to the low level. Thus, the transistors Qa and Qb are turned off so that the state of the I/O pin becomes high impedance HZ. After the I/O pin becomes the high impedance HZ, write data WD is inputted at the I/O pin. Then, at a time $t_{21}$, the signal $\overline{WE}$ is turned to the H level. Since the output disable buffer ODB has the latching function, the output signal OPD is kept at the H level after the signal $\overline{WE}$ is turned to the H level. Accordingly, the output $N_{33}$ of the AND gate $G_1$ becomes the H level so that the write enable buffer WEB begins to operate to turn its output signal DW to the H level. After the dynamic data write-in buffer DWB receives the H level signal DW, the dynamic data write-in buffer DWB receives write data from the I/O pin and latches it. Then the data is outputted through the data buses DB and $\overline{DB}$ to the memory cell to be written therein. After the writing operation is completed, at a time $t_{31}$, the signal $\overline{RAS}$ and the signal $\overline{CAS}$ are turned to the H level so that the signal $\overline{CE}$ is turned to the H level. The H level signal CE resets all of the circuits output disable buffer ODB, write enable buffer WEB, data output buffer DOB and dynamic data write-in buffer DWB. In the time interval I/O HZ between the times $t_{11}$ and $t_{21}$, the I/O pin is kept at the high impedance HZ. In the time interval W between the times $t_{21}$ and $t_{31}$, writing operation is performed. After the time $t_{31}$, it is the reset interval RST. Thus, in this embodiment, the I/O pin is turned to the high impedance HZ by using the fall of the signal $\overline{WE}$ as a clock signal. Also, the writing operation can be started by using the rise of the signal $\overline{WE}$ as a clock signal. As a result, the data write-in buffer DWB can be made as a dynamic circuit.

Figure 5C:
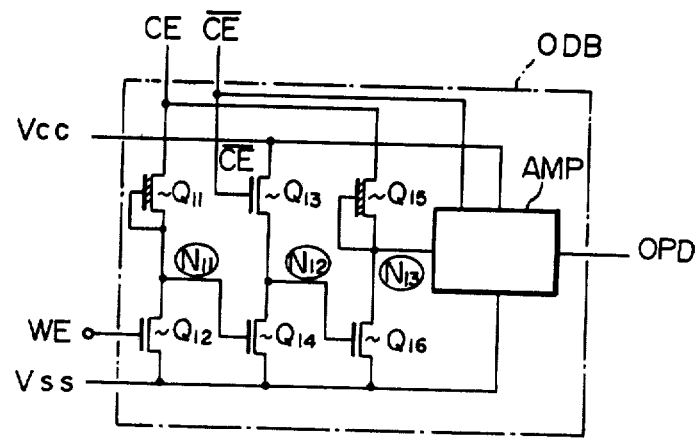
FIG. 5C is a circuit diagram of the output disable buffer included in the column circuit of FIG. 5A.

The column circuit illustrated in FIG. 5A will be explained in more detail with reference to FIGS. 5C through 5G. FIG. 5C is a circuit diagram of the output disable buffer ODB. Referring to FIG. 5C, the output disable buffer ODB comprises depletion-type MOS transistors $Q_{11}$ and $Q_{15}$, enhancement-type MOS transistors $Q_{12}$, $Q_{13}$, $Q_{14}$ and $Q_{16}$, and an amplifier AMP. The transistors $Q_{11}$ and $Q_{12}$, as well as the transistors $Q_{15}$ and $Q_{16}$ are connected in series between the column enable input CE and the ground voltage $V_{ss}$. The transistors $Q_{13}$ and $Q_{14}$ are connected in series between the power supply voltage $V_{cc}$ and the ground voltage $V_{ss}$. The amplifier AMP is connected between the power supply voltage $V_{cc}$ and the ground voltage $V_{ss}$. The gate and the source of the transistor $Q_{11}$, the drain of the transistor $Q_{12}$ and the gate of the transistor $Q_{14}$ are connected to a point $N_{11}$. The source of the transistor $Q_{13}$, the drain of the transistor $Q_{14}$ and the gate of the transistor $Q_{16}$ are connected to a point $N_{12}$. The gate and the source of the transistor $Q_{15}$, and the drain of the transistor $Q_{16}$ are connected to a point $N_{13}$ which is connected to an input of the amplifier AMP. The amplifier provides the output disable signal OPD.

Figure 5D:
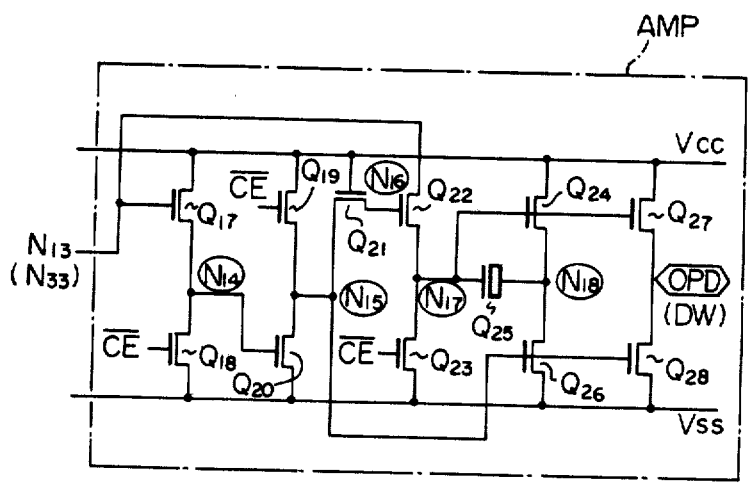
FIG. 5D is a circuit diagram of an amplifier included in the output disable buffer ODB of FIG. 5C.

An example of the circuit diagram of the amplifier AMP is illustrated in FIG. 5D. In FIG. 5D, the amplifier AMP consists of transistors $Q_{17}$ through $Q_{28}$. Since this amplifier AMP is a conventional amplifier, further explanation of this amplifier AMP is not given here.

Figure 5E:
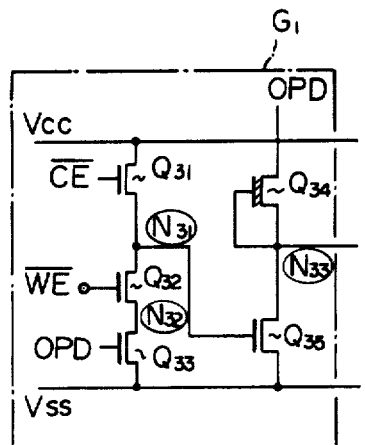
FIG. 5E is a circuit diagram of an AND gate included in the column circuit of FIG. 5A.

FIG. 5E is a circuit diagram of the AND gate $G_1$. In FIG. 5E, the AND gate $G_1$ comprises of enhancement-type MOS transistors $Q_{31}$, $Q_{32}$, $Q_{33}$ and $Q_{35}$, and a depletion-type MOS transistor $Q_{34}$. The transistors $Q_{31}$, $Q_{32}$ and $Q_{33}$ are connected in series between the power supply voltage $V_{cc}$ and the ground voltage $V_{ss}$. The transistors $Q_{34}$ and $Q_{35}$ are connected in series between the output OPD of the output data buffer ODB and the ground voltage $V_{ss}$. The source of the transistor $Q_{31}$, the drain of the transistor $Q_{32}$ and the gate of the transistor $Q_{35}$ are connected to a point $N_{31}$. The source of the transistor $Q_{32}$ and the drain of the transistor $Q_{33}$ are connected to a point $N_{32}$. The gate and the source of the transistor $Q_{34}$, and the drain of the transistor $Q_{35}$ are connected to a point $N_{33}$ which is connected to an input of the write enable buffer WEB (FIG. 5A). The gate of the transistor $Q_{31}$ receives the inverted column enable signal $\overline{CE}$. The gate of the transistor $Q_{32}$ receives the inverted write enable signal WE. The gate of the transistor $Q_{33}$ and the drain of the transistor $Q_{34}$ receive the output signal OPD from the output disable buffer ODB (FIG. 5A).

Figure 5F:
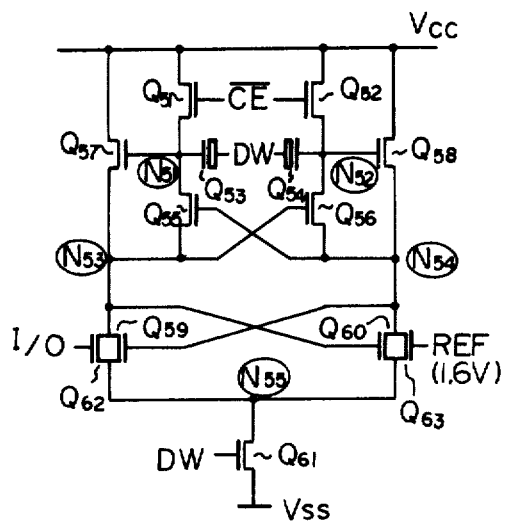
FIG. 5F is a circuit diagram of a part of a data write-in buffer included in the column circuit of FIG. 5A.

FIG. 5F is a circuit diagram of a part of the dynamic data write-in buffer DWB. Referring to FIG. 5F, this circuit is a flip-flop, that is, a latching circuit, including transistors $Q_{51}$, $Q_{52}$, ..., and $Q_{63}$. The drains of the transistors $Q_{51}$, $Q_{52}$, $Q_{57}$ and $Q_{58}$ are connected to the power supply voltage $V_{cc}$. The source of the transistor $Q_{51}$ is connected through a point $N_{51}$ to the darin of the transistor $Q_{55}$. Similarly, the source of the transistor $Q_{52}$ is connected through a point $N_{52}$ to the drain of the transistor $Q_{56}$. The gates of the transistor $Q_{53}$ and $Q_{57}$ are connected to the point $N_{51}$. Similarly, the gates of the transistors $Q_{54}$ and $Q_{58}$ are connected to the point $N_{52}$. The source of the transistor $Q_{57}$ is connected through a point $N_{53}$ to the drains of the transistors $Q_{59}$ and $Q_{62}$ connected in parallel. Similarly, the source of the transistor $Q_{58}$ is connected through a point $N_{54}$ to the drains of the transistors $Q_{60}$ and $Q_{63}$ connected in parallel. The gates of the transistors $Q_{56}$ and $Q_{60}$, and the source of the transistor $Q_{55}$ are connected to the point $N_{53}$. Similarly, the gates of the transistors $Q_{55}$ and $Q_{59}$, and the source of the transistor $Q_{56}$ are connected to the point $N_{54}$. The sources of the transistors $Q_{59}$ and $Q_{62}$ are connected in parallel, and the sources of the transistors $Q_{60}$ and $Q_{63}$ are connected in parallel, being connected through a point $N_{55}$ to the drain of the transistor $Q_{61}$. The source of the transistor $Q_{61}$ is connected to the ground voltage $V_{ss}$. The gates of the transistors $Q_{51}$ and $Q_{52}$ are adapted to receive the inverted column enable signal $\overline{CE}$. The drain of the transistor $Q_{53}$ is connected to its source. Similarly, the drain of the transistor $Q_{54}$ is connected to its source. The transistors $Q_{53}$ and $Q_{54}$ receive the output signal DW from the write enable buffer WEB (FIG. 5A). The gate of the transistor $Q_{62}$ receives write data from the I/O pin. The gate of the transistor $Q_{63}$ receives a reference voltage REF which is typically 1.6 V.

Figure 5G:
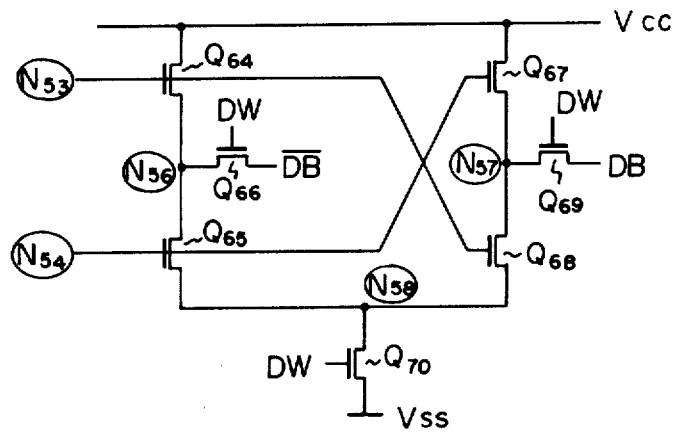
FIG. 5G is a circuit diagram of the other part of the data write-in buffer.

FIG. 5G is a circuit diagram of the other part of the data write-in buffer DWB. Referring to FIG. 5G, this circuit has a function to write the data latched in the circuit of FIG. 5F into the memory cell (not shown), including transistors $Q_{64}, Q_{65}, \ldots$, and $Q_{70}$. The drains of the transistors $Q_{64}$ and $Q_{67}$ are connected to the power supply voltage $V_{cc}$. The source of the transistors $Q_{64}$ is connected through a point $N_{56}$ to the drain of the transistor $Q_{65}$. Similarly, the source of the transistor $Q_{67}$ is connected through a point $N_{57}$ to the drain of the transistor $Q_{68}$. The sources of the transistors $Q_{65}$ and $Q_{68}$ are connected through a point $N_{58}$ to the drain of the transistor $Q_{70}$. The source of the transistor $Q_{70}$ is connected to the ground voltage $V_{ss}$. The source of the transistor $Q_{66}$ is connected to the point $N_{56}$. Similarly, the source of the transistor $Q_{69}$ is connected to the point $N_{57}$. The gate of the transistor $Q_{64}$ is connected to the point $N_{53}$ (FIG. 5F) and to the gate of the transistor $Q_{68}$. Similarly, the gate of the transistor $Q_{65}$ is connected to the point $N_{54}$ (FIG. 5F) and to the gate of the transistor $Q_{67}$. The gates of the transistors $Q_{66}, Q_{69}$ and $Q_{70}$ receive the output driving signal DW from the write enable buffer WEB (FIG. 5A). The drain of the transistor $Q_{66}$ is connected to the inverted data bus $\overline{DB}$. Similarly, the drain of the transistor $Q_{69}$ is connected to the data bus DB.

Figure 5H:
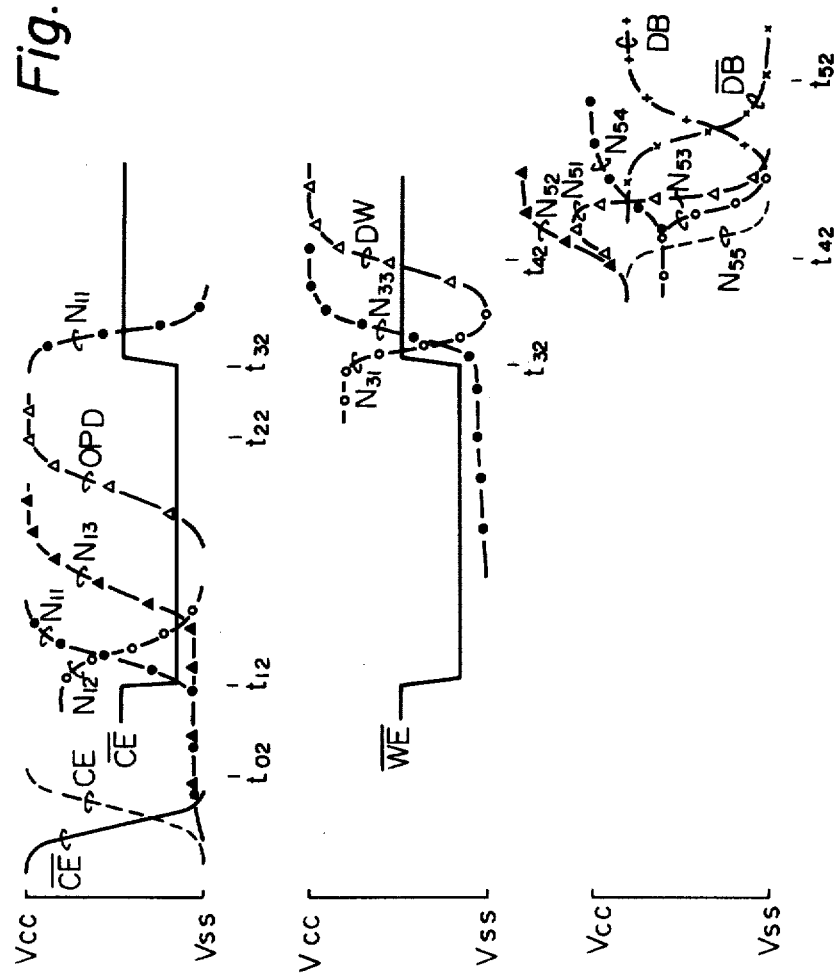
FIG. 5H is a time chart for explaining the operations of the circuits of FIGS. 5C through 5F.

FIG. 5H illustrates time charts for explaining the operations of the circuits of FIGS. 5C through 5F.

Referring to FIGS. 5C and the upper portion of FIG. 5H, the operation of the output disable buffer ODB will now be explained. At a time $t_{02}$, it is assumed that the column enable signal CE is the H level and therefore the inverted column enable signal $\overline{CE}$ is the L level so that the output disable buffer ODB is in its enable state. Also, at the same time $t_{02}$, the inverted write enable signal $\overline{WE}$ applied to the gate of the transistor $Q_{12}$ is the H level. Therefore, at this time $t_{02}$, the potential at the point $N_{11}$ is the L level. Since the transistor $Q_{14}$ is in an off state because its gate connected to the point $N_{11}$ is the L level, the potential at the point $N_{12}$ is kept at the H level which has been charged up before the signal $\overline{CE}$ is turned to the L level. Also, since the transistor $Q_{16}$ is in an on state because of its gate connected to the point $N_{12}$ is the H level, the point $N_{13}$ is the L level. Then, at a time $t_{12}$, the inverted write enable signal $\overline{WE}$ is turned to the L level. The transistor $Q_{12}$ is then turned off so that the point $N_{11}$ connected to its drain is charged up to be the H level. Because of the H level of the point $N_{11}$, the transistor $Q_{14}$ is turned on so that the point $N_{12}$ is discharged to the L level. Then, the transistor $Q_{16}$ is turned off so that the point $N_{13}$ is charged up to the H level. The H level signal at the point $N_{13}$ is amplified by the amplifier AMP which provides the H level output OPD at a time $t_{22}$ when the H level output OPD is given to the data output buffer DOB (FIG. 5A), the I/O pin becomes the high impedance HZ as hereinbefore described. Then, after write data is applied to the I/O pin, at a time $t_{32}$, the inverted write enable signal $\overline{WE}$ is turned again to the H level. Thus, the transistor $Q_{12}$ is turned on so that the point $N_{11}$ is discharged to the L level. The L level of the point $N_{11}$ turns off the transistor $Q_{14}$. However, since the inverted column enable signal $\overline{CE}$ is the L level, the point $N_{12}$ is not charged up. Therefore, even after the time $t_{32}$, the point $N_{13}$ and thus the output signal OPD is kept at the H level.

Referring now to FIG. 5E and the middle portion of FIG. 5H, the operation of the AND gate $G_1$ will be explained. After the high level output OPD is applied to the drain of the transistor $Q_{34}$ and to the gate of the transistor $Q_{33}$, at the time $t_{32}$, when the inverted write enable signal $\overline{WE}$ applied to the gate of the transistor $Q_{32}$ is turned to the H level, the point $N_{31}$ is discharged to the L level so that the transistor $Q_{35}$ is turned off. Therefore, the point $N_{33}$ is charged up to the H level. The H level signal at the point $N_{33}$ is amplified by the write enable buffer WEB (FIG. 5A) which provides the H level output DW at a time $t_{42}$.

The constitution of the write enable buffer WEB (FIG. 5A) is substantially the same as that of the amplifier 10 illustrated in FIG. 5D. Since the amplifier 10 is a well known one, the operations of the amplifier 10 and the write enable buffer WEB are not explained here.

Now, referring to FIGS. 5F, 5G and the lower portion of FIG. 5H, the operation of the dynamic data write-in buffer DWB will be explained. Briefly, at the time $t_{42}$, when the H level output DW is supplied from the write enable buffer WEB (FIG. 5A) to the dynamic data write-in buffer DWB, the dynamic data write in buffer DWB begins to operate so that the write data from the I/O pin is latched in it and then the latched data is written through the data buses DB and $\overline{DB}$ to the memory cell. More precisely, when the H level signal DW is applied to the gates of the transistor $Q_{61}$ and to the sources of the transistors $Q_{53}$ and $Q_{54}$, the point $N_{55}$ is discharged to be the L level; and the transistors $Q_{53}$ and $Q_{54}$ used as capacitors boost up the potential of the points $N_{51}$ and $N_{52}$ connected to their gates. If the write data from the I/O pin is the H level, the point $N_{53}$ is discharged to the L level and the point $N_{54}$ is kept at the H level, therefore, the point $N_{51}$ is discharged through the transistor $Q_{55}$. While, the point $N_{52}$ is not discharged and further boosted up to be a higher level than the $V_{cc}$ level, because the transistor $Q_{56}$ is turned off. Therefore, the point $N_{54}$ is charged up to the $V_{cc}$ level. The L level of the point $N_{53}$ and the H level of the point $N_{54}$ are latched in their states. In this state, the transistors $Q_{57}$ and $Q_{60}$ are cut off, and the transistors $Q_{58}$ and $Q_{59}$ are on. Therefore, the circuit illustrated in FIG. 5F does not consume DC power. Also, the circuit illustrated in FIG. 5G does not consume DC power. The L level signal at the point $N_{53}$ is applied to the gates of the transistors $Q_{64}$ and $Q_{68}$. The H level signal at the point $N_{54}$ is applied to the gates of the transistors $Q_{65}$ and $Q_{67}$. The H level output DW is also applied to the gates of the transistors $Q_{66}, Q_{69}$ and $Q_{70}$. Therefore, the point $N_{56}$ is discharged and the point $N_{57}$ is charged up. Accordingly, at a time $t_{52}$, the potential of the data bus DB rises to the H level, while the potential of the data bus $\overline{DB}$ falls to the L level.

As can be seen from FIGS. 5F and 5G, when the H level output signal DW is supplied to the gates of the transistors $Q_{61}$ and the dynamic $Q_{70}$, and data write-in buffer DWB operates, the data write-in buffer does not consume the DC power. Therefore, in comparison with the conventional column circuit, power consumption is greately reduced according to this embodiment.

Figure 6A:
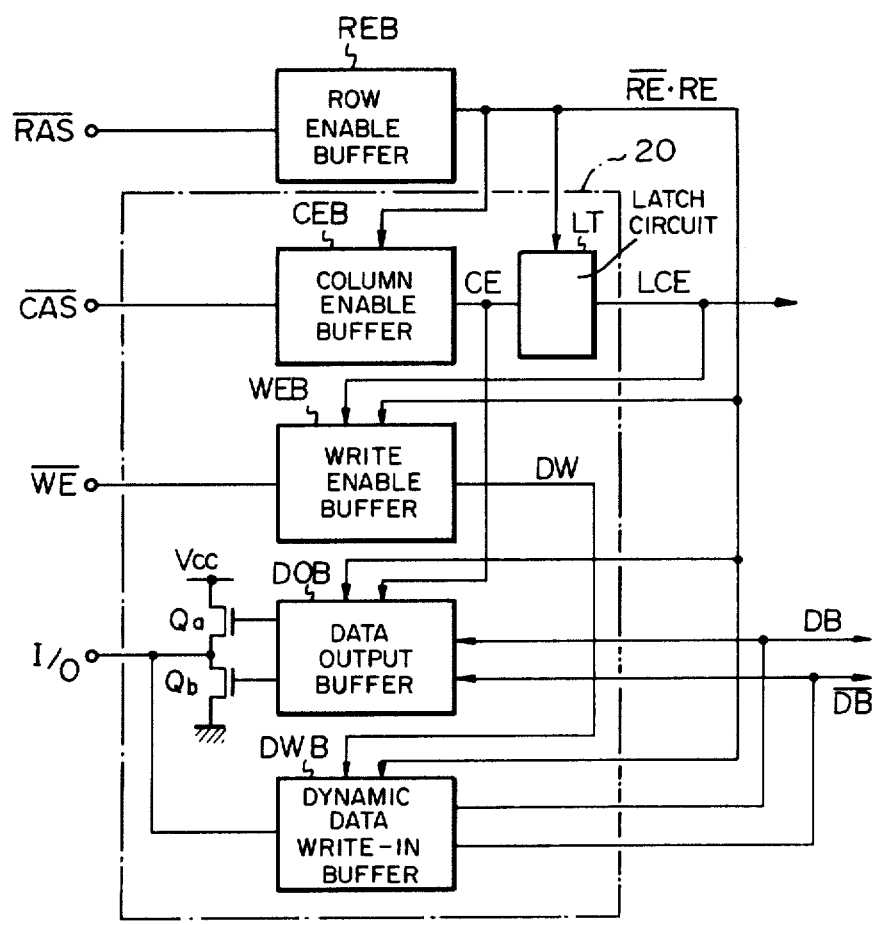
FIG. 6A is a block diagram for illustrating a part of a column circuit of a dynamic memory device, according to another embodiment of the present invention.

FIG. 6A is a block diagram for illustrating a part of a column circuit of a dynamic memory device, according to another embodiment of the present invention. Referring to FIG. 6A, the column circuit 20 according to this second embodiment includes also the column enable buffer CEB, the write enable buffer WEB, the data output buffer DOB, the dynamic data write-in buffer DWB, which are all included in the column circuit of the first embodiment, and a latching circuit LT. The inverted row enable signal $\overline{RE}$ is imputted not only to the column enable buffer CEB but also to the write enable buffer WEB, the data output buffer DOB, the dynamic data write-in buffer DWB, and the latching circuit LT so that $\overline{RE}$ resets these circuits. The column enable signal CE from the column enable buffer CEB is inputted to the latch circuit LT and the data output buffer DOB. The latch circuit LT outputs a latched column enable signal LCE which is supplied to the write enable buffer WEB. Also, the signal LCE is supplied to the other circuits in this column circuit 20 instead of the signal CE in FIG. 5A. The output signal DW from the write enable buffer WEB is inputted to the dynamic data write-in buffer DWB. The other constituents are the same as the column decoder of FIG. 5A.

Figure 6B:
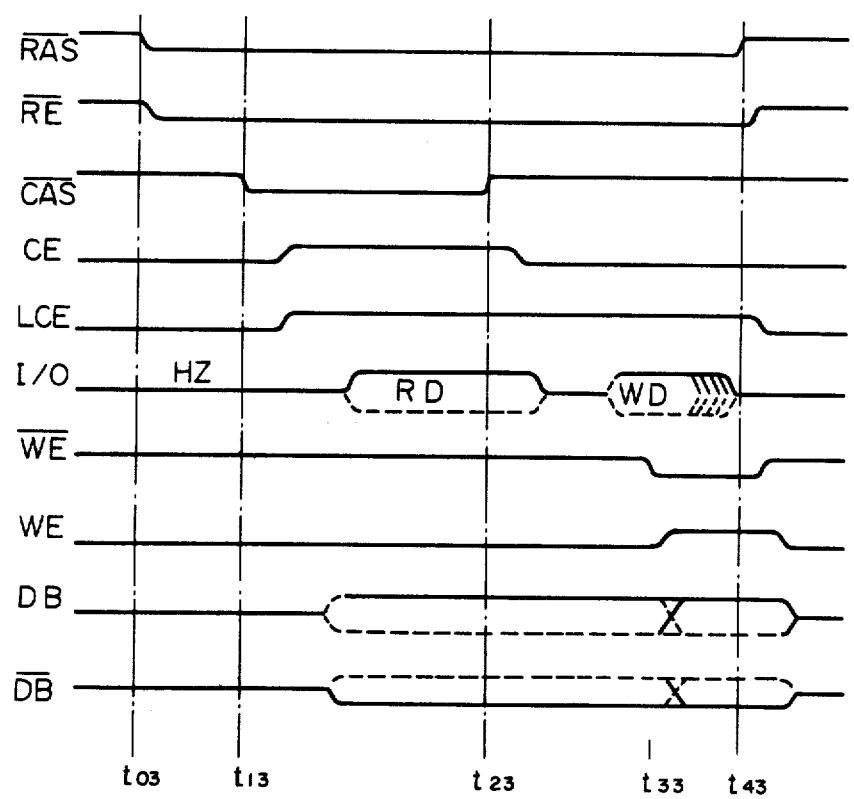
FIG. 6B is a time chart for explaining the operation of the column circuit of FIG. 6A.

FIG. 6B is a time chart for explaining the operation of the column circuit 20 of FIG. 6A. Referring to FIGS. 6A and 6B, at a time $t_{03}$, the inverted row address strobe signal $\overline{RAS}$ is turned to the L level so that the row enable buffer REB is set to its enable state. The inverted row enable signal $\overline{RE}$ is accordingly turned to the L level, and the row enable signal RE to the H level. Then, at a time $t_{13}$, the column address strobe signal $\overline{CAS}$ is turned to the L level. In response to the L level of the signal $\overline{CAS}$, the column enable signal CE and the latched column enable signal LCE are turned to the H level. The write enable buffer WEB is then set to its enable state by the H level of the signal LCE from the latching circuit LT. The data output buffer DOB is set to its enable state by the H level of the signal CE from the column enable buffer CEB. At this stage, I/O pin outputs the read data from the memory cell through the data buses DB and $\overline{DB}$, the data output buffer DOB, and the three-state circuit to the I/O pin. After this, at a time $t_{23}$, the signal CAS is turned to the H level. In response to the H level of the signal CAS, the signal CE is turned to the L level. When the data output buffer DOB receives the L level signal CE, it turns off the transistors Qa and Qb resulting in high impedance at the I/O pin. While, by the function of the latching circuit LT, the latched column enable signal LCE is kept at the H level even when the signal CE has been turned to the L level. Therefore, the write enable buffer WEB is in its enable state after the time $t_{23}$. Then, at a time $t_{33}$, when the inverted write enable signal $\overline{WE}$ is turned to the H level, the write enable buffer WEB outputs the H level signal DW which is inputted to the dynamic data write-in buffer DWB. Thus, write data is latched and then written into the memory cell through the data buses DB and $\overline{DB}$.

From the foregoing description, it will be apparent that, according to the present invention, since a data write-in buffer in a column decoder is of a dynamic type, power consumption in a semiconductor memory device can be reduced in comparison with a conventional semiconductor memory device. In addition, since no additional clock signal is required to drive the dynamic data write-in buffer DWB, the number of pins is not increased.

If should be noted that the present invention may be adapted to a semiconductor memory device having any memory capacity, and is not restricted to the forgoing embodiments. Various changes and modifications are possible without departing from the basic idea and scope of the invention.

I claim:

1. A semiconductor memory device of a dynamic type comprising a memory cell and a column circuit, operatively connected to said memory cell and operatively connectable to receive column driving signals, said column circuit including a read/write circuit for reading data from or writing data into said memory cell in response to the column driving signals, said read/write circuit comprising:

a common input/output terminal for inputting write data into or for outputting read data from said memory cell;

a data output buffer, operatively connected to said common input/output terminal, for receiving said read data from said memory cell and for generating control signals;

a three-state circuit, operatively connected to said common input/output terminal and to said data output buffer, for receiving said control signals and for generating and applying a first level signal or a second level signal or applying a high impedance to said common input/output terminal according to said control signals; and a data write-in buffer having a latching function and operatively connected between said common input/output terminal and said memory cell;

said column circuit further comprising:

first means, operatively connected to said data output buffer and operatively connectable to receive said column driving signals, for generating an output disable signal and for causing said data output buffer to generate a high impedance control signal for causing said three-state circuit to apply the high impedance state, in response to one of said column driving signals; and second means, operatively connected to said common input/output terminal and to said data write-in buffer, for latching said write data applied to said common input/output terminal into said data write-in buffer after said three-state circuit has applied said high impedance state, in response to another one of said column driving signals.

2. A semiconductor memory device as claimed in claim 1, wherein said data write-in buffer is a dynamic circuit comprising:

a bistable circuit, operatively connected to said common input/output terminal, for latching said write data; and a write-in circuit, operatively connected to said bistable circuit and to said memory cell, for writing the latched-write data into said memory cell.

3. A semiconductor memory device as claimed in claim 1 or 2, wherein in said read/write circuit further comprises a write enable state;

wherein said data write-in buffer further comprises an enable state;

wherein said column driving signals comprise a write enable signal for setting said read/write circuit to the write enable state when said write enable signal is turned on;

wherein said first means comprises a latching circuit, operatively connected to said data output buffer, for providing a latched driving signal, in response to a turning on of said write enable signal, wherein said latched driving signal being used to cause said three-state circuit to apply the high impedance even after said write enable signal is turned off; and wherein said second means comprises a gate circuit, operatively connected to said latching circuit and to said data write-in buffer, having a first input for receiving said latched driving signal and having a second input for receiving said write enable signal, said gate circuit for generating a data write-in buffer-driving signal for setting said data write-in buffer to an enable state so as to latch said write data, in response to the turning off of said write enable signal.

4. A semiconductor memory device as claimed in claim 1 or 2, wherein said data output buffer further comprises a write enable state;

wherein said column driving signals comprise a write enable signal and a column-address strobe signal, said column address strobe signal being used to set said data output buffer to the write enable state when said column-address strobe signal is turned off, said first means causing said common input-/output terminal to remain at a high impedance when said column-address strobe signal is turned off; and wherein said second means comprises:
 a latching circuit, operatively connected to receive said column-address strobe signal, for generating a latched signal for keeping said column-address strobe signal ON even after said column-address strobe signal is turned off; and
 a write-enable buffer, operatively connected to said latching circuit and to said data write-in buffer, for generating a driving signal which is inputted into said data write-in buffer, said driving signal being generated when both said write-enable signal and said latched signal are applied to said write-enable buffer, said data write-in buffer latching said write data when said data write-in buffer receives said driving signal.

5. A semiconductor memory device, operatively connectable to receive write data, a row address strobe signal, a column address strobe signal and a write enable signal, comprising:

a memory cell for storing the write data and for generating read data;

a row enable buffer, operatively connectable to receive the row address strobe signal, for generating a row enable signal in dependence upon the row address strobe signal;

a column enable buffer, operatively connected to said row enable buffer and operatively connectable to receive the column address strobe signal, for generating a column enable signal in dependence upon the row enable signal and the column address strobe signal;

an output disable buffer, operatively connected to said column enable buffer and operatively connectable to receive the write enable signal, for generating an output disable signal in dependence upon the column enable signal and the write enable signal;

an AND gate, operatively connected to said output disable buffer and operatively connectable to receive the write enable signal, for generating an output signal in dependence upon the write enable signal and the output disable signal;

a write enable buffer, operatively connected to said column enable buffer and said AND gate, for generating a driving signal in dependence upon the column enable signal and the output signal;

a data output buffer, operatively connected to said output disable buffer, said column enable buffer and said memory cell, for generating control signals in dependence upon the output disable signal, the column disable signal and the read data;

a three-state circuit, operatively connected to said data output buffer, for generating output data or applying a first impedance level in dependence upon the control signals;

an input/output terminal, operatively connected to said three-state circuit and operatively connectable to receive the write data, for passing therethrough the write data and the output data; and a dynamic data write-in buffer, operatively connected to said input/output terminal, said column enable buffer, said write enable buffer and said memory cell, for passing therethrough the write data in dependence upon the column enable signal and the driving signal, so that when the write data is passed through said dynamic data write-in buffer said three-state circuit applies the first impedance level.

6. A semiconductor memory device as claimed in claim 5, wherein said dynamic write-in circuit comprises:

a bistable circuit, operatively connected to said input/output terminal, said column enable buffer and said write enable buffer, for latching the write data in dependence upon the column enable signal and the driving signal; and a write-in circuit, operatively connected to said bistable circuit, said write enable buffer and said memory cell, for writing the latched write data into said memory cell in dependence upon the driving signal.

7. A semiconductor memory device, operatively connectable to receive write data, a row address strobe signal, a column address strobe signal and a write enable signal, comprising:

a memory cell for storing the write data and for generating read data;

a row enable buffer, operatively connectable to receive the row address strobe signal, for generating a row enable signal in dependence upon the row address strobe signal;

a column enable buffer, operatively connected to said row enable buffer and operatively connectable to receive the column address strobe signal, for generating a column enable signal in dependence upon the row enable signal and the column address strobe signal;

a latching circuit, operatively connected to said column enable buffer and said row enable buffer, for generating a latched column enable signal in dependence upon the column enable signal and the row enable signal;

a write enable buffer, operatively connected to said latching circuit and to said row enable buffer and operatively connectable to receive the write enable signal, for generating a driving signal in dependence upon the latched column enable signal, the row enable signal and the write enable signal;

a data output buffer, operatively connected to said column enable buffer, said row enable buffer and said memory cell, for generating control signals in dependence upon the column enable signal, the row enable signal and the read data;

a three-state circuit, operatively connected to said data output buffer, for generating output data or applying a first impedance level in dependence upon the control signals;

an input/output terminal, operatively connected to said three-state circuit and operatively connectable to receive the write data, for passing therethrough the write data and the output data; and a dynamic data write-in buffer, operatively connected to said input/output terminal, said write enable buffer, said row enable buffer and said memory cell, for passing therethrough the write data in dependence upon the row enable signal and the driving signal, so that when said write data is passed through said dynamic data write-in buffer said three-state circuit applies the first impedance level.

8. A semiconductor memory device as claimed in claim 7, wherein said dynamic write-in circuit comprises:

a bistable circuit operatively connected to said input/output terminal, said row enable buffer and said write enable buffer, for latching the write data in dependence upon the row enable signal and the driving signal; and a write-in circuit, operatively connected to said bistable circuit, said write enable buffer and said memory cell, for writing the latched write data into said memory cell in dependence upon the driving signal.

* * * * *